United States Patent [19]

Humphrey

[11] Patent Number: 4,797,633

[45] Date of Patent: Jan. 10, 1989

[54] AUDIO AMPLIFIER

[75] Inventor: Theodore J. Humphrey, Los Angeles, Calif.

[73] Assignee: Video Sound, Inc., Boulder City, Nev.

[21] Appl. No.: 28,551

[22] Filed: Mar. 20, 1987

[51] Int. Cl.$^4$ .............................................. H03F 3/04
[52] U.S. Cl. ...................................... 330/297; 330/310
[58] Field of Search ................. 330/297, 310, 127, 129

[56] References Cited

U.S. PATENT DOCUMENTS

4,442,407 4/1984 Apel ...................................... 330/297

Primary Examiner—Gene Wan
Attorney, Agent, or Firm—Nemschoff & Supnik

[57] ABSTRACT

An audio amplifier has a collapsible power supply coupled to an audio amplifier circuit to drive voltage rails of the power supply in an inverse relationship to the power consumed by the amplifier circuit. A variable gain input stage includes a linear potentiometer gain control followed by a gain stage and buffer to drive separate bass and treble controls, summed before appearing at the input of an integrated circuit amplifier. The main voltage amplification is provided by an integrated circuit, supplied with power by common base circuits to isolate the integrated circuit from power supply induced distortion. Staggered output stages are coupled to the output of the amplifier, the earlier stages having a longer duty cycle and light duty factor, while the later stages having a shorter duty cycle and heavier duty factor. A voltage doubler sensing power drawn by amplifier to modify voltage rails available at the output of the amplifier circuit. A low impedance shunt regulated power supply is coupled to supply a stable low impedance voltage at the preamplifier stages.

16 Claims, 10 Drawing Sheets

AUDIO AMPLIFIER

FIELD OF THE INVENTION

This invention relates to electronic amplifiers. In particular, the invention pertains to high fidelity audio amplifiers.

BACKGROUND OF THE INVENTION

Various tradeoffs are made in designing high fidelity sound equipment. Considerations involved in the design decision include size, power output, distortion, loudspeaker protection, cost, freedom from clipping, efficiency, ability to drive low impedance, heat dissipation, large damping factor, use of low cost parts and reliability. Some factors are often sacrificed for others. Thus, low cost may be of primary importance, or having a large damping factor may be of greater significance.

Apparent but unnecessary conflicts may exist between these factors. For example, an amplifier with a large damping factor will have a large loop gain. This can cause the amplifier to sound "bad" when it clips as the loop gain tends to over-drive the output stages when driven into clipping (saturation). This is the main reason why some decide that tube amplifiers or amplifiers with low loop gain sound better. But it is possible to design an amplifier with much loop gain without significant distortion from clipping.

Clipping tends to be the most serious form of distortion in an amplifier, as it is most unnatural. Harmonic distortion is made up of frequencies which are multiples of the main frequency. For this reason, they are similar to the frequencies in music. IM (inharmonic distortion) is composed of signals which are the addition and difference of two input frequencies. This form of distortion is not as acceptable as harmonic distortion, but less serious than clipping.

Clipping produces frequencies which have no relationship to the input frequency. The percentage of distortion can go very quickly above 10% once clipping starts. Clipping occurs when the input requests that the output signal from the amplifier be too large for it to reproduce. The internal circuitry of the amplifier continues to try to answer this request and therefore drives the output transistors into saturation. Once the output transistors are in saturation, they will stay in that condition long after the input signal is removed. If the amplifier has much internal gain, the problem can be worse as the internal circuitry will try even that much harder to track the input.

An amplifier goes into saturation when it is asked to drive a load with a voltage too "close" to its power supply voltage rails. For music, an amplifier is generally asked to do this quite often. Various studies have shown that the ratio of peak voltages in music to RMS is in the range of 17 to 20 db in high quality material. Assuming a figure of 17 db. (which is a factor of 50 to 1) for an amplifier to deliver 2 watts RMS, it must be able to handle peak outputs of over 100 watts. This explains why in order to have good fidelity, many amplifiers are in the range of 100 to 200 watts. They are in fact simply trying to reproduce 2 to 5 watts cleanly.

The ratio of peak power to RMS power is commonly referred to as headroom. Whenever an amplifier has less headroom than the music it is reproducing requires, there will be clipping. This clipping can be either soft, hard or uncontrolled. In the past, anti-clipping circuits have been used to prevent clipping distortion. Soft anti-clipping circuits, i.e. those circuits which sense the input to reduce gain have been used, but some clipping can still occur and this type of circuit reduces the dynamic range. Hard anti-clipping circuits reduce the drive when needed to prevent clipping.

Here, soft clipping will be defined as where there is a circuit which monitors the output (or input) and reduces the gain of the amplifier to a point where it is expected not to clip to a significant extent. Hard clipping is defined as an amplifier with a circuit that prevents output transistors from being driven into saturation and therefore, the amplifier does not exhibit the undesirable persistence side effects of clipping, i.e. the output transistors staying in saturation after the input signal has gone away. Uncontrolled saturation as exists in "normal" circuits where the output transistor can be over-driven by the driving circuits into saturation which persists long after the loss of the input signal.

A commonly designed amplifier rated 100 watts per channel with a 3 db headroom will deliver 200 watts peak power. At an output of 4 watts RMS it has a headroom of 17 db. Above this power, clipping will start to occur more often. On high quality music, this amplifier will not be used above this level of 4 watts per channel RMS.

The problem is that the above 100 watt amplifier will generally have a very large power supply, possibly even a regulated power supply. It will have large output transistors with large heat sinks and most probably will have output protection circuitry on the amplifier. Yet, this is all to reproduce only 4 watts RMS per channel.

SUMMARY OF INVENTION

An audio amplifier in accordance with this invention generally includes a collapsible power supply and a power amplifier circuit. The amplifier has an input for receiving a signal and an output stage for coupling the amplifier circuit to a load such as a loudspeaker. Means are provided for sensing power drawn from the power supply by the power amplifier circuit and for reducing the voltage, and thus power supplied by the power supply to the amplifier circuit in an inverse relationship to the power drawn.

In another example of the invention, the power amplifier circuit includes staggered output stages. A first output stage is operable at lower currents over a relatively lengthy duty cycle, while subsequent output stages are operable at higher currents, though over a shorter duty cycle. This allows the use of high quality fast semiconductor components at lower power consumption for the first stage, and accessing a heavier higher power stage as needed over a relatively short duty cycle.

In a more specific example, the power amplifier has a main gain stage provided by an integrated circuit which is isolated from the main power supply by common base circuits. This allows the integrated circuit to accurately control the output despite a varying supply voltage from the power supply.

Additional features in accordance with this invention include preamplifier stages having separate treble and base tone control circuits providing signals which are summed by the power amplifier. A variable gain is provided as the first stage of the amplifier. Localized feedback at the output of the integrated circuit helps provide stability. The means for sensing power drawn by the amplifier circuit includes a voltage doubler circuit in the power supply.

BRIEF DESCRIPTION OF THE DRAWINGS

The nature of the invention described herein may be best understood and appreciated by the following description taken in connection with the accompanying drawings in which.

DETAILED DESCRIPTION

Figure 1:
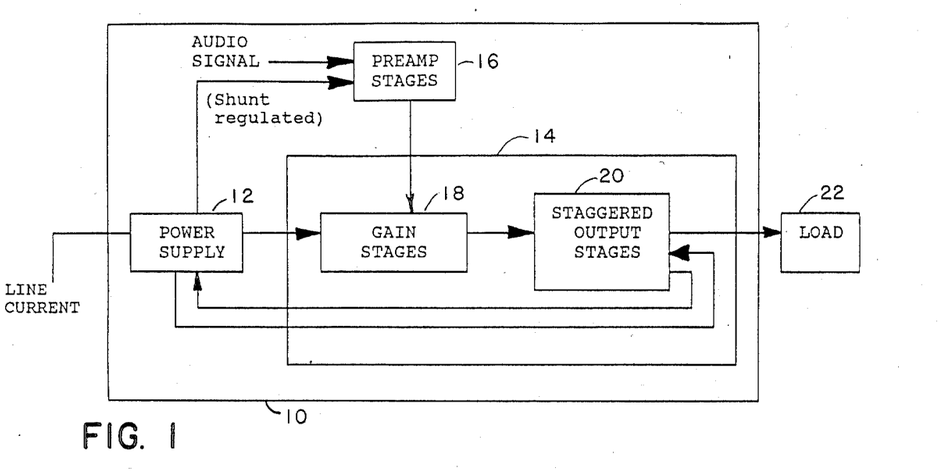
FIG. 1 is a simplified block diagram of an example of an audio amplifier in accordance with the invention.

With particular reference to FIG. 1, a simplified block diagram of an audio amplifier 10 is shown in accordance with this invention. The audio amplifier 10 is designed for reproducing 4 watts per channel RMS while being able to produce 200 watt peaks without a standard large power supply. The audio amplifier 10 generally comprises a power supply 12 and a main amplifier circuit 14. Preamplifier stages 16 are coupled to the main amplifier circuit 14. The preamplifier stages 16 includes a variable gain input, balance control, a buffer and tone control circuits. The power amplifier 14 includes gain stages 18 and staggered output stages 20 coupled to the gain stages 14. In addition to the power amplifier circuit 14, the power supply 12 is coupled to the preamplifier stages 16 and the staggered output stages 20. The staggered output stages 20 are coupled to a load 22, such as loudspeakers. The power supply 12 is responsive to the power drawn by the load 22, conceptually represented by a return arrow from the staggered output stages 18 back to the power supply 12.

The power supply 12 is essentially collapsible. This means that as the power drawn from it increases, the voltage available decreases. The supply 12 senses the amount of power being drawn from it and reduces the available power, by reducing the voltage, when it is asked for more than the designed 4 watts RMS. It can supply the "high" voltages needed to reproduce the large peak outputs while handling a much lower level of RMS power. By having the high voltage available under "normal" conditions, the amplifier will clip much less often than in a standard amplifier arrangement.

Figure 2:
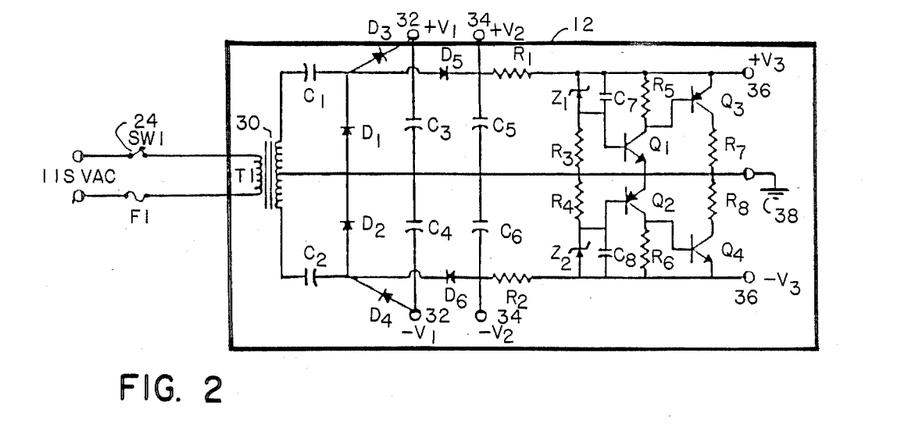
FIG. 2 is a partial schematic diagram of the audio amplifier depicted in FIG. 1 showing the power supply.
Figure 3:
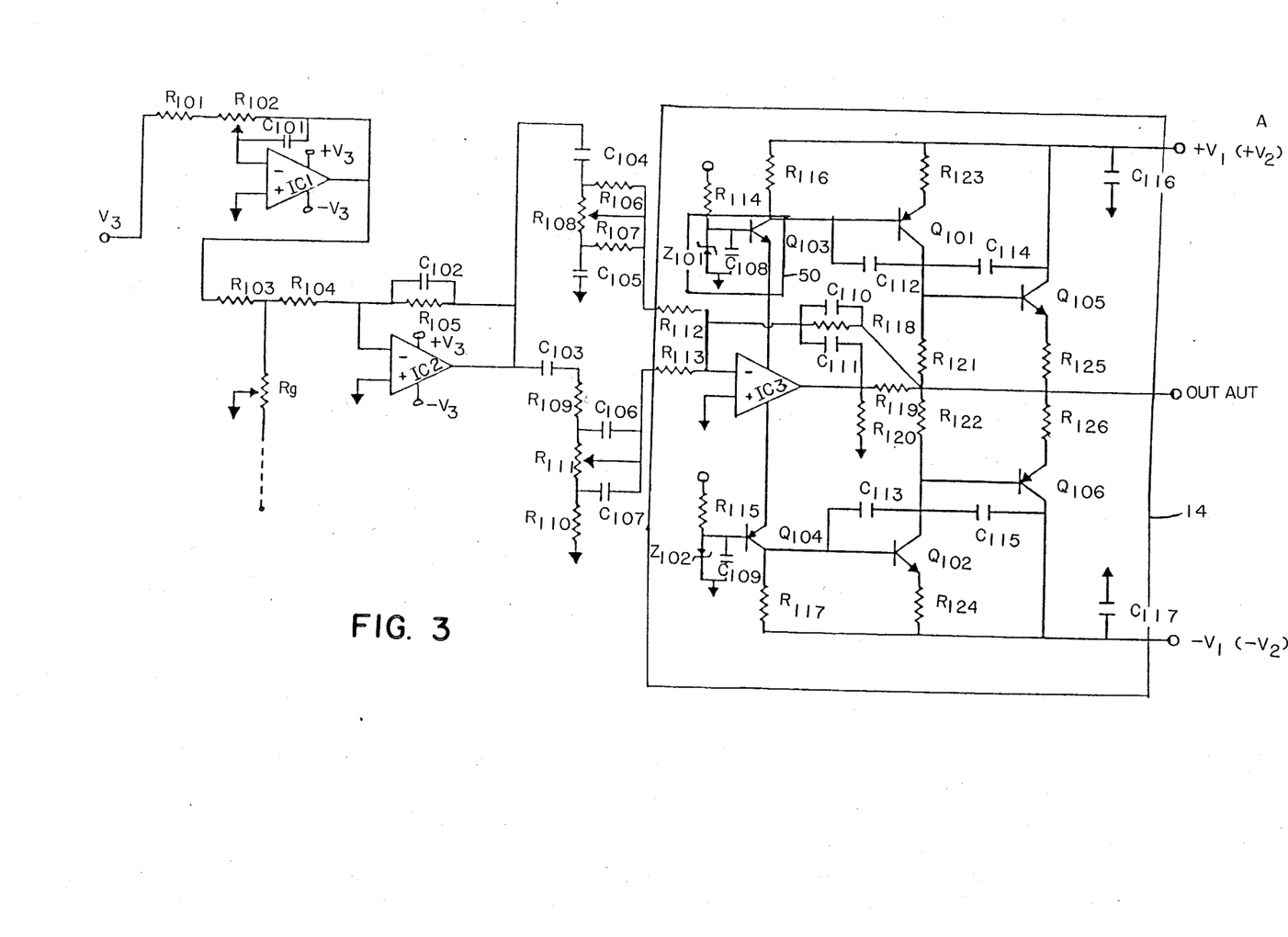
FIG. 3 is a partial schematic diagram of the audio amplifier depicted in FIG. 1 showing input, main amplifier and staggered output stages.

With particular reference to FIGS. 1, 2 and 3, an example of the invention is shown in which the power supply 12 comprises a variation of a voltage doubler circuit. It has a transformer 30 (T1) for supplying a voltage to the power supply 12. The power supply 12 has six outputs 32, 34, 36, besides ground 38. It has capacitors C1 and C2, along with diodes D1 and D2, common to two doublers. Diodes D3 and D4 and C3 and C4 are coupled to supply outlets +V1 and −V1 for a first channel. Diodes D5 and D6, C5 and C6 are coupled to supply outlets +V2 and −V2 for a second channel.

In this manner at light load each channel has ability to use all the power from the transformer T1. Since at normal listening levels, only a limited level of RMS power is required, energy needed to draw upon is generally in reserve. Under heavier loads each is restricted to approximately ½ of the potential power of the transformer.

These voltages +V, −V, +V2 and −V2 are normally at ±35 volts but go down to ±23 volts under very heavy loads. This protects the output transistor Q105, Q106 and also the loads 20 (loudspeakers). Fuse F1 protects the circuit by blowing in the event that too much power is drawn over time. The rest of the components of the power supply 12 form a pair of shunt regulators 40. These are used for low level circuits and as references for the common base circuits 50.

A power switch 60 is coupled to the primary 62 of an ordinary power transformer 30 (T1). The primary 62 is also fused by fuse 64 (F1). The transformer 30 (T1) has a secondary windings 66 coupled by capacitors C1, C2 to diodes D1, D2, D3 and D4, D5 and D6. This circuit supplies voltages +V1 and −V1 and complementary voltages +V2, −V2.

Shunt Regulated Power Supply

Reference zener diodes Z1 and Z2 along resistors R1, R2 and R3 and R4, R5 and R6, R7 and R8 and Q1, Q2, Q3 and Q4, form a pair of shunt regulators which regulate the power supply voltage down to ±15 volts for use by low level circuitry and as a reference.

FIG. 3 for simplicity depicts a schematic for a single channel of the audio amplifier 10, though two identical channels are available and are supplied power separately via outlet voltages +V2 and −V2 from the power supply 12.

Variable Gain Stage

The sound control circuit 100 includes separate volume, bass and treble controls. A variable gain input stage 70 comprises an input resistor R101 is coupled to a potentiometer R102 coupled to the input of an operational amplifier IC1 to provide a volume control of the variable gain type. An input signal is applied at input R101. The volume is adjustable at the input via resistor R101 by potentiometer R102. Potentiometer R9 is coupled between R103 and R104 and functions as a balance control between channels. The output of IC1 is coupled to resistors R103 and R104 in series. The gain of IC1 is determined by R104 divided by R103. Resistor R103 and R9 act as an attenuator and so function as a balance between channels. IC2 provides a gain stage and buffer 74 to drive separate tone controls.

Since variable gain appears at the input of the amplifier, it provides the ability to handle a wide range of input levels. This also allows for driving low impedances and increased freedom from hum.

Tone Controls

The tone controls 80 are driven by the buffer IC2. The output of IC2 is coupled via capacitor C104 to a frequency sensitive network comprising potentiometer R108, and resistors R106 and R107, and capacitor C105. This provides the treble circuit. Similarly, for the bass circuit the output of IC2 is also applied via capacitor C103 to a second frequency sensitive network comprising potentiometer R111, and resistors RI09 and R110 and capacitors CI06 and C107. The output of the treble and bass signals appear respectively across R112 and R113 where the signals are summed by the power amplifier 14, the gain being R118/RI12 or R118/RI13. Separate treble and bass circuits give increased protection from introduction of hum into the system. This circuit also produces minimum phase distortion because the tone controls are passive and not active circuits.

Main Amplifier Stage

Common base circuits 90 supply a near constant voltage at the supply terminals of IC3 and allow any current drawn by IC3 to be reflected across R116 or R117 for positive or negative drive signals.

The supply voltage for the power amplifier 14 of about ±38 volts is too much for IC3 so that it is brought down to about +10 volts by use of R114, Z101 (C108) and Q103 which establishes one common base circuit and R115, Z102 (C107) and Q104 which provides the second common base circuit.

The integrated circuit IC3 is thereby isolated from the large voltages needed by the power amplifier 14. Isolation is achieved by an application of the first and second common base circuits. This isolates the integrated circuit IC3 and lets the IC control the voltage across sensing resistors 92 (R116, and R117 for the complementary common base circuit) which in turn drive the output circuitry. As a by-product, the result is a nearly regulated voltage at the rails of the IC3.

A feature of the design of the amplifier in accordance with the invention is also the use of the common base circuit to effectively isolate the IC while letting one "know" of its demands and responding thereof to. A resistor R118 is coupled at one end to a summing point 94 at the input of IC3, and at the other end to the power amplifier output 100 to which resistors R121, R122 and R119 is joined and which is coupled to the output or load 100. Current passes through R121 and R122 to the output summing point 96 before going to load. A capacitor C110 is coupled between the summing point 94 at the input of IC3 to the summing point 96 at the output 100 to the load. A capacitor C111 is coupled from the summing point 94, the input to the IC3 to the output of IC3. The function of local feedback provided by R119, R120, and frequency compensation provided by C110 (and C111) is to provide fo local and overall feedback for the circuit and to determine the gain, which is established by R118, R112 and R113.

The gain of the power amplifier 14 is determined by a circuit comprising capacitor C110, C111, R112, R113 and R118. R118 by R112 (R113) determines the gain of the amplifier, while capacitor C111 provides local feedback for the amplifier. With the addition of C110 this circuit gains the ability to track input signals thus preventing TIM and slew limiting distortion.

The overall gain of the amplifier circuit might ordinarily approach 10,000,000 for a good quality integrated circuit IC3. The closed loop gain is about 50 and thus the loop gain is close to one million at low frequency. This reduces the output impedance and increases the damping factor by one million.

R119 is applied to the output signal and R120 couples the output signal to ground. The ratio of the resistance of R119/R120 is set to about 10, which defines a stable gain of this internal gain. This internal gain stage with localized feedback gives IC3 the drive it needs to drive the output stages.

In supplying the positive and negative outputs, current is delivered to the load 100 through $R_{122}$ and $R_{121}$. As the current requirements, as sensed across R122 and R121, are increased, the transistors Q105 and Q106 turn on as needed to supply large amounts of current to the load. Since the last output stage is normally biased off, there is no runaway problem.

A higher quality is achieved by effectively reducing the amount of clipping distortion which occurs by maintaining the power supply at higher levels than normal for the RMS rating of the amplifier. In the usual audio amplifier of 100 watts per channel, the amplifier has set voltage rails which do not vary. This requires a large power supply, requiring protection circuitry and large power transistors. Typically, this means that while the power generally required to the load is 5 watts RMS, the larger power is available to be able to handle 100 watt peaks. The amplifier must be able to handle this 100 watts RMS in case of a short. In the present example of the invention, there is perhaps 1-5 watts RMS, yet the amplifier can still deliver the needed peak without distortion.

In this example, rather than the expensive and large power supply required for the larger amplifiers which deliver RMS 100 watts RMS, there is a much smaller power supply which can deliver 20 watts RMS a channel. The complex protection circuitry usually required becomes unnecessary. Also, active protection circuitry which otherwise would be required has a tendency to affect the sound quality by producing its own forms of distortion.

The ultimate effect of the invention is to enable a speaker to sound louder than when coupled to another audio amplifier because it is not clipping. In this design there are no components on the output, such as inductors, fuses and resisters that follow the amplifier. Such components have a tendency to interfere with control of the amplifier over the speaker. They increase the output impedance at higher frequencies and introduce their own distortion. Low output impedance of the amplifier directly relates to control of the speaker.

Normally, when set in motion, the voice coil of the speaker can create a back EMF. Here, that EMF is dampened by the lower output impedance, thus preventing the speaker cone from moving on its own. This can protect the speaker making it more difficult to accidently ruin a speaker, since only 20 watts RMS can be applied to the speaker, despite the headroom. But at 2 watts RMS, the amplifier will still put out 200 watt peaks.

Class B

The amplifier does not fit any known category as to class. The use of "staggered" stages as explained further on allow one to have certain stages in a normally off state (Class B) thus resulting in increased stability, lower power dissipation and lack of thermal runaway. This is only possible because an earlier stage of the staggering is "fully" on and able to handle the output properly. Each stage of the "stagger" has its functions and domain which it is to function.

Staggered Output

An arrangement of staggered output stages allows the use of smaller transistors. A latter stage output contributes current when the "feedforward" from earlier stages cannot supply what power is needed. Thus, the last stage of power output is provided by Q105 at 1–10 amperes, whereas Q103, Q104 each handle the range of about 0 to 1 amperes.

Q101 and Q102 sense the current drawn by IC3 in response to an input signal via R116 or R117 and deliver output current to the load in proportion to this sensed drive signal. Q101 (and Q102) supply current on a more "constant" basis to the load but at a lower level. Whereas Q105 and Q106 supply large amounts of current at lower duty cycle, thus producing a smaller average dissipation for this final output stage.

Any demand for much current to the load is sensed across R121 and R122 thus turning on Q105 and Q106 to aid in supplying of current to the load.

Q101 and Q105 (and Q102 and Q106) form two stages in a staggering.

Similarly in larger amplifiers, an additional stage could be added for the range of 5–30 amperes. Because of staggering the output, later stages have lower duty factors. Thus, the second stage might be active 2% of the time so that on the average, it would only be dissipating 2% of 100 watts or 2 watts. Earlier stages at a higher duty factor but have lower peak dissipation, thus, 100% duty factor at an average of 2 watts which gives 2 watts total. This allows the use of slower high current transistors at the later stages, while allowing the use of high quality, small, fast transistors at the earlier stages. While the last stage has to handle large amounts of dissipation and current for short periods of time, it is at a lower duty cycle. This allows the stage to recover (thus leading to lower RMS dissipation) between the demands for large power output.

Power Supply Induced Distortion

Figure 4:
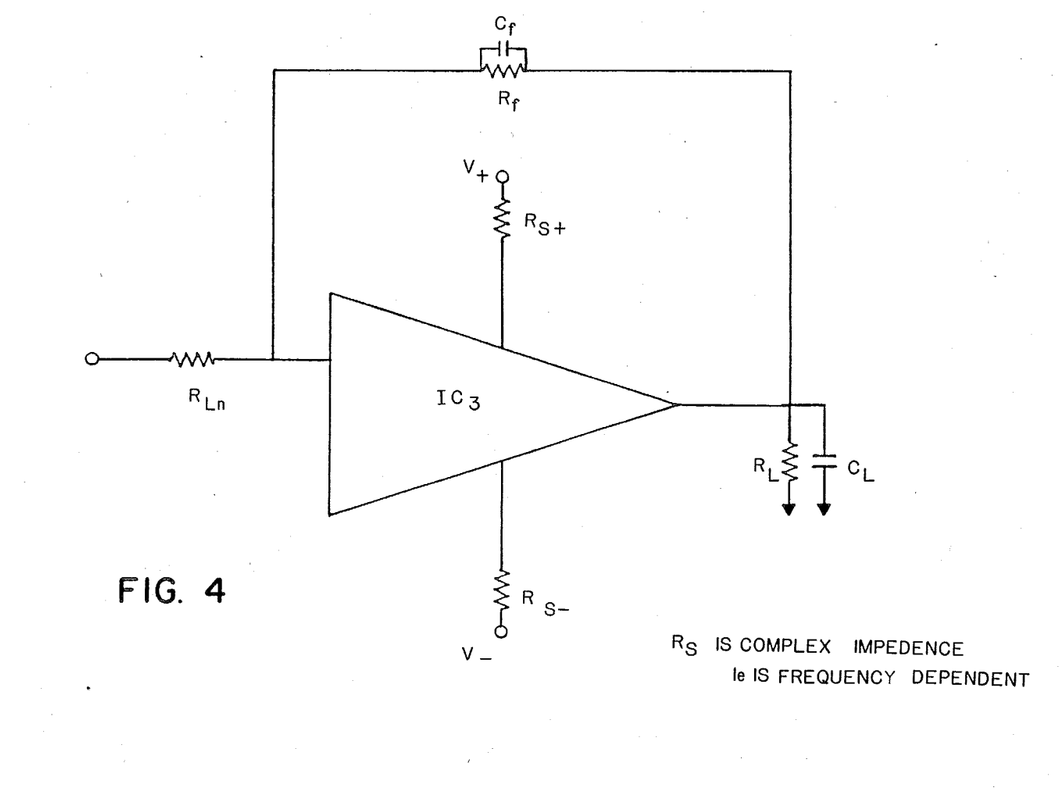
FIG. 4 is a simplified and idealized representation of a basic amplifier circuit as used in the audio amplifier of FIG. 1 for purposes of illustrating and designing amplifiers according to this invention.

Another form of distortion is induced by the power supply itself. Power supply induced distortion (PSID) has been isolated but is difficult to measure. With particular reference to FIG. 4, an idealized representation of an amplifier with external components is shown. When driving a load, the amplifier will output some current to the load. This current must come from the power supply. Because of the impedance of the power supply there will be a voltage difference generated at the power supply. At a lessor or greater amount this change in power supply will generate a signal internal to the amplifier which can be thought of as originating at the input. This signal is then amplified by the amplifier and appears at the output of the amplifier. The signal will be the same frequency as the original signal but phase delayed. This distortion can be calculated. When the percentage becomes greater than 100%, oscillations occur normally associated with unbypassed power supply legs. At lesser percentages, ringing occurs. The formula for the distortion is as follows:

$$\%PSID = 100(A_L/R_L)X_{PS}R_S$$

where all are frequency dependent
$A_L$ is closed loop gain of the amplifier
$R_L$ is load impedance
$R_S$ is power supply impedance
$X_{PS}$ is a factor showing the portion of the AC voltage on the rails reflected at the input of the amplifier.

$$A_L = (F/(F+F_C))A_{LDC}$$

where $F_C$ is the high frequency dependent 3 db point of the amplifier and $A_{LDC}$ gain.

$R_L$ can go down or up depending on the speaker. An electrostatic speaker which goes down is the most difficult to drive.

$R_S$ generally starts to rise around 1 MHz, but can be much sooner than 1 MHz.

$$X_{PS} = ((F+F_X)/F)X_{PSDC}$$

where $F_X$ is the point that the amplifier starts to become more sensitive to power supply variations. $F_X$ can be as low 1 Hz.

By examining the formula, it is apparent why it is difficult for normal amplifiers to drive electrostatic speakers, capacitive by nature. As the impedance of the speaker ($R_L$) goes down with increasing frequency, the amplifier will have a tendency to ring or even to oscillate.

The general solution in "high-end" audio equipment to this problem has been to go to very large, very well filtered, even high regulated power supplies to keep the impedance of the power supply low, i.e. low $R_S$. This will then keep down PSID. If these techniques were used in the present invention, the benefits would be lost.

$R_S$ has appeared to be the easiest of the variables to control. But the proper control of any of these would handle PSID. One cannot change $R_L$, and $A_L$ is pretty much set also, but one can handle $X_{PS}$.

Figure 5:
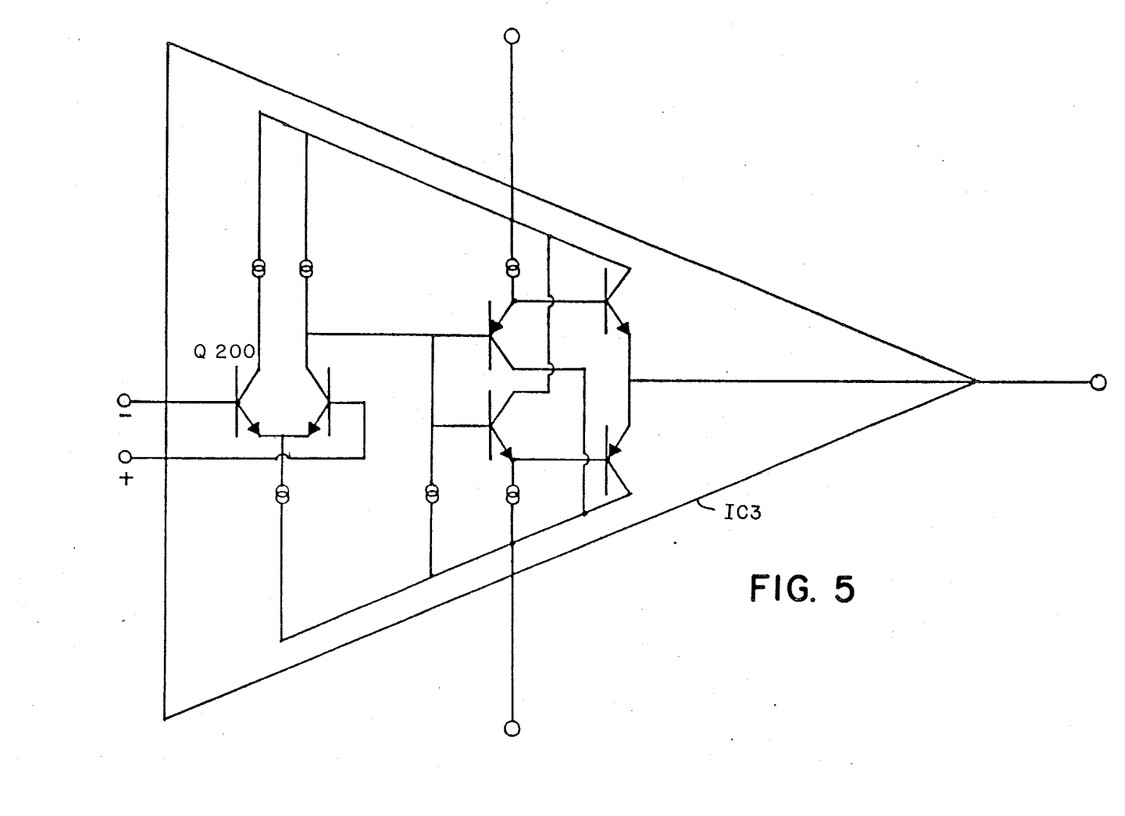
FIG. 5 depicts an idealized representation of the internal circuitry of an operational amplifier of the type depicted in FIG. 4 for purposes of illustrating and designing amplifiers according to this invention.

FIG. 5 shows an idealized operational amplifier, normally within an integrated circuit. If such a device could be used to control an amplifier with the proper isolation from "raw" power supply voltages, then we could be assured of decreased sensitivity to power supply variations.

Figure 6:
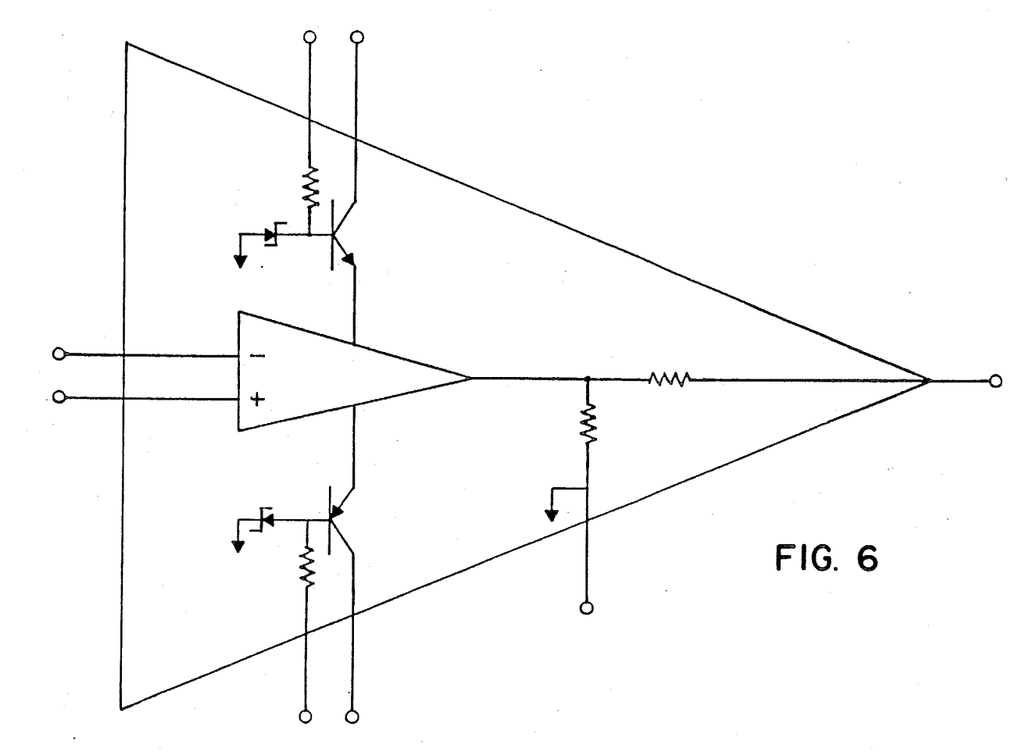
FIG. 6 depicts a building block for use in the amplifier of FIG. 1, as could be constructed from the IC in FIG. 5 showing the additional of the dual voltage buffering common base stages, and localized feedback resistors at the output.

FIG. 6 shows a building block that could be used as the core of such an amplifier. The IC operational amplifier itself sees a fairly constant voltage at its rails no matter what may be occurring with the rest of the amplifier. As the IC is primary control gain, this guarantees that any variation on the main supply will not be induced back into the signal path.

Figure 7:
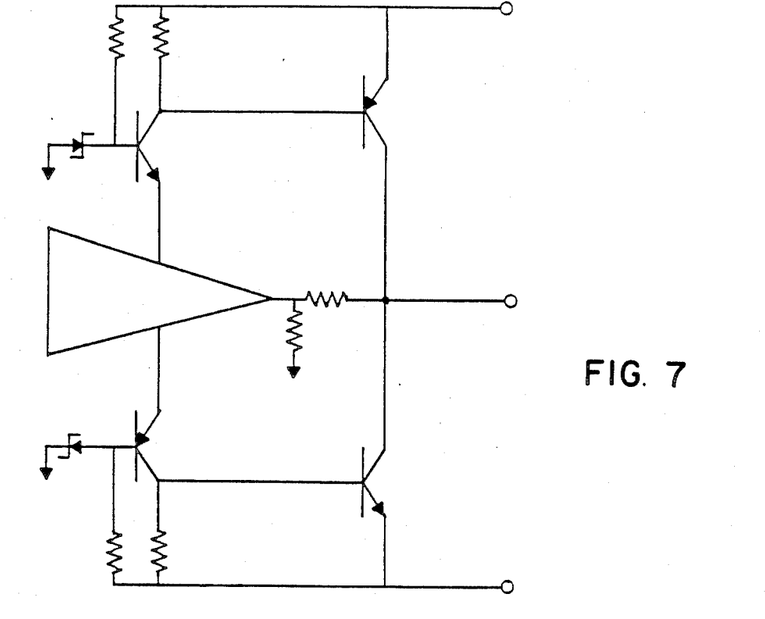
FIG. 7 depicts the building block of FIG. 6 for use in the amplifier of FIG. 1, with the addition of an output stage.
Figure 8:
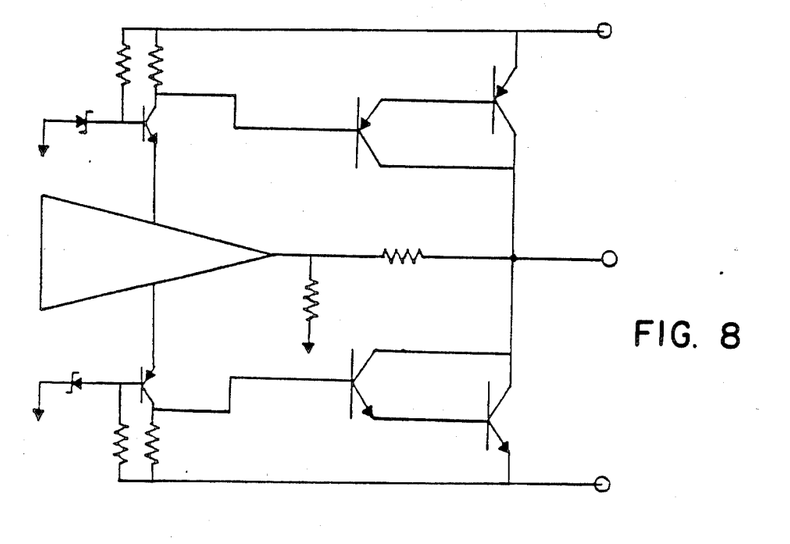
FIG. 8 depicts the building block of FIG. 6 for use in the amplifier of FIG. 1 with the addition of Darlington configured transistors in the output stage.
Figure 9:
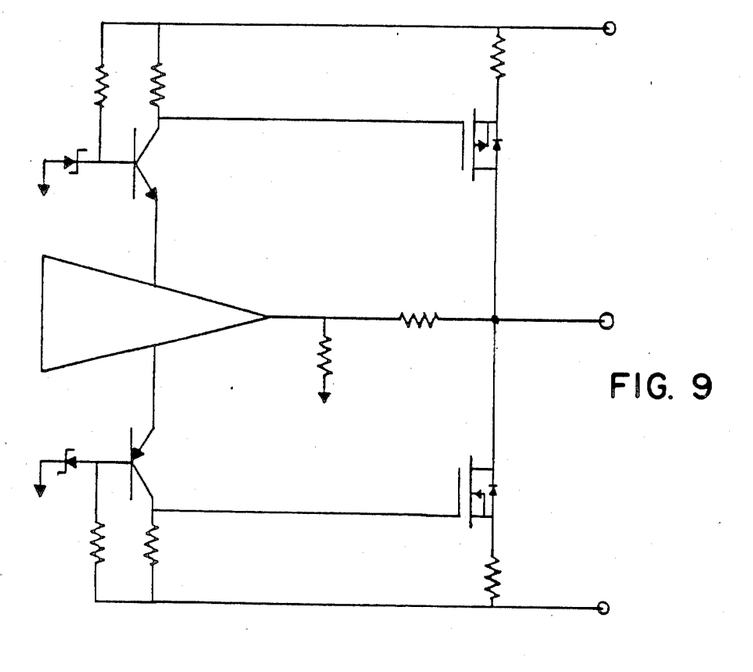
FIG. 9 depicts the building block of FIG. 6 for use in the amplifier of FIG. 1 with the addition of MOSFET transistors in the output stage.
Figure 10:
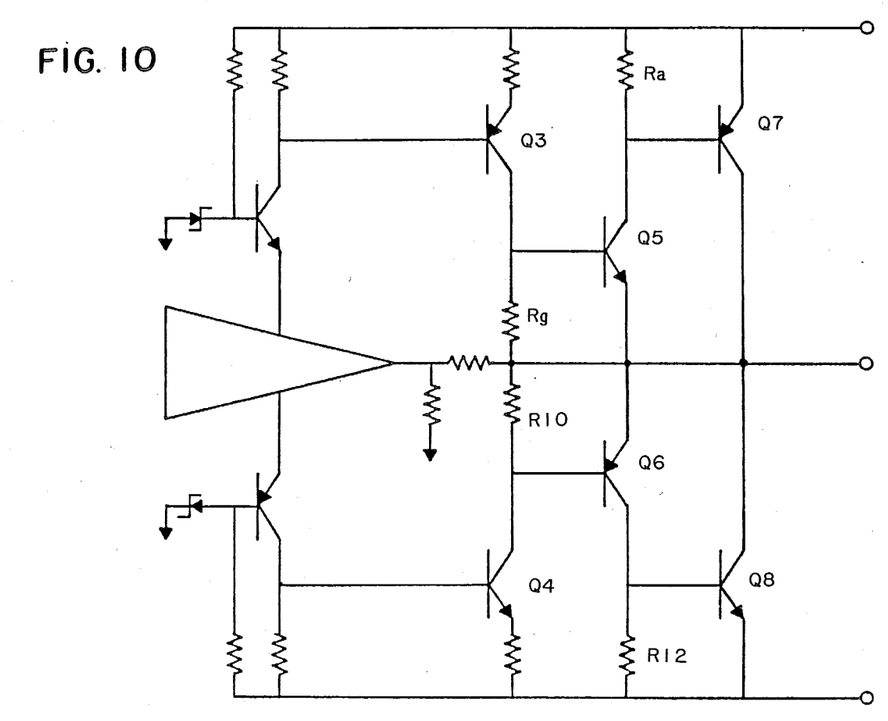
FIG. 10 depicts the building block of FIG. 6 for use in the amplifier of FIG. 1 with the addition three staggered output stages.
Figure 11:
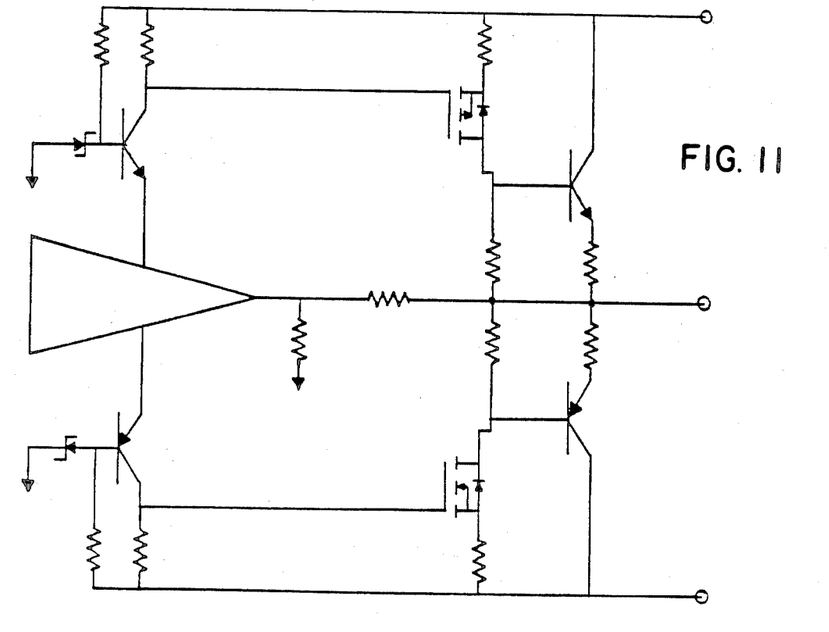
FIG. 11 depicts the building block of FIG. 6 for use in the amplifier of FIG. 1 with the addition of staggered MOSFET transistors and bipolar transistors in the output stages.
Figure 12:
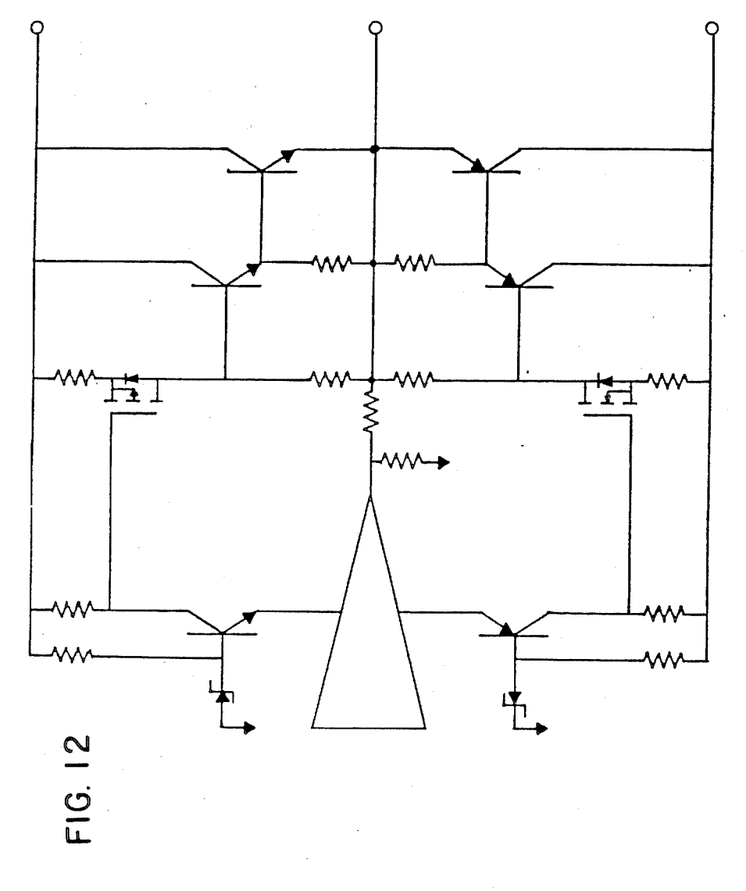
FIG. 12 depicts the building block of FIG. 6 for use in the amplifier of FIG. 1 with the addition of staggered MOSFET transistors and two stages of bipolar transistors in th output stages.
Figure 13:
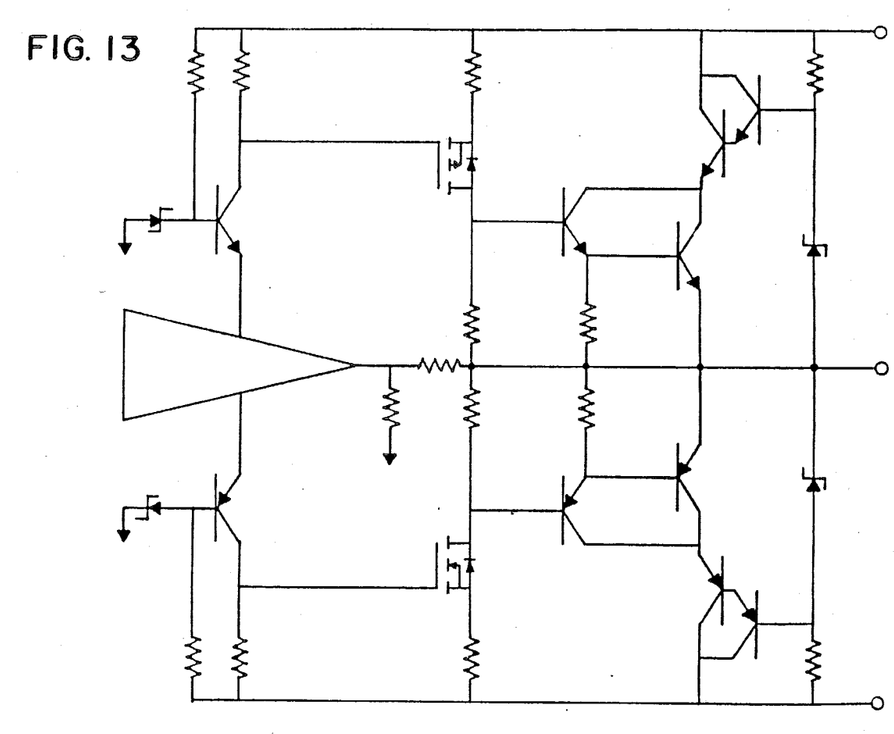
FIG. 13 depicts the building block of FIG. 6 for use in the amplifier of FIG. 1 with the use of preregulation for latter stages of staggering.

FIGS. 7–13 show possible configurations for basic use of the invention around the building blocks shown in FIG. 6. FIG. 7 is the simplest showing the addition of two transistors for an output stage. FIG. 8 use Darlington transistors or discrete transistors for the output stage. FIG. 9 shows the same for a pair of MOSFET transistors. FIG. 10 shows a more complex arrangement that demonstrates the concept of staggering for the output stage FIGS. 11 & 12 shows the use of a MOSFET early in the line of staggering to improve quality more by isolating the drive area from the otput stages even more. FIG. 13 shows the invention in connection with the use of preregulated the output supply voltage for the latter stages of staggering.

Thus, the use of a collapsing power supply, has made it possible to use a much smaller output stage and heat sinks and still realize the same performance at the RMS range of interest, i.e., 1–5 watts. Active output protection is not needed a the transistors can handle the RMS power of the power supply long enough for the fuse to blow in an adverse situation. The amplifier in accordance with this invention has thus been created to more closely match the demands of music reproduction.

While the invention has been described with reference to specific forms thereof, it will be understood that changes and modifications maybe made within the spirit and scope of this invention.

What is claimed is:

1. An audio amplifier comprising:
 a power supply for supplying a direct current voltage;
 an amplifier circuit coupled to the power supply to receive the direct current voltage, the amplifier circuit having an input for receiving a signal and an output stage, the output stage for coupling the amplifier to an audio transducer, the amplifier circuit drawing power from the power supply;
 means for sensing the power drawn from the power supply and means for reducing the available voltage provided by the power supply to the amplifier circuit in an inverse relationship to the power drawn from the power supply;
 whereby the power supply is collapsible, in that the voltage rails available to drive the output stage is limited by the output power drawn to enable the generation of an efficient audio output signal minimizing the effects of clipping distortion.

2. The invention as set forth in claim 1 and comprising first and second output stages disposed in staggered relationship, the first output stage comprising means for operating at a first duty cycle with a first duty factor, the second output stage comprising means for operating at a second duty cycle with a second duty factor, the second duty factor greater than the first duty factor, and the second duty cycle shorter than the first duty cycle,
 whereby the first stage manages a lower power over a long duty cycle and the second stage manages a greater power over a shorter duty cycle.

3. The invention as set forth in claim 3 and in which the amplifier circuit comprises an integrated circuit gain stage providing an input to the staggered output stages, the power supply for providing a supply voltage to the integrated circuit gain stage the integrated circuit gain stage comprising means for isolating variations on the supply voltage from the power supply.

4. The invention as set forth in claim 3 and in which the integrated circuit supply voltage isolating means comprising a common base circuit coupling the power supply voltage to the integrated circuit.

5. The invention as set forth in claim 4 and in which the integrated circuit stage having a output and local feedback means impedance for providing a localized feedback amplifier gain at the output of th integrated circuit stage.

6. The invention as set forth in claim 5 and in which the local feedback impedance means comprises a first resistor coupled to ground and a second resistor coupled to the output stage.

7. The invention as set forth in claim 4 and in which the amplifier circuit having a closed loop gain of in excess of 10,000,000.

8. The invention as set forth in claim 1 and in which the means for sensing the power drawn from the power supply means comprising a voltage doubler circuit.

9. The invention a set forth in claim 4 and in which the power supply provides a shunt regulated voltage coupled to the integrated circuit stage, thereby providing a stable low impedance power supply to minimize power supply induced distortion.

10. The invention as set forth in claim 4 and comprising a variable gain input circuit and separate bass and treble tone control circuits, each bass and treble tone control circuits coupled and applied to and summed by the amplifier circuit.

11. An audio amplifier comprising:
 a power amplifier circuit for amplifying an audio signal;
 a power supply for supplying a direct current to the amplifier circuit;
 the power amplifier circuit having an output stage for coupling the amplifier to an audio transducer,
 the power supply coupled to and responsive to the output stage for reducing the voltage available to the amplifier in response to power drawn:
 first and second output stages disposed in staggered relationship,
 means for coupling the power supply to the first output stage;
 means for adjusting the voltage rails available from the power supply, the voltage rails adjustment means coupled to and responsive to the output stage and coupled to the power supply;
 the first output stage comprising means for operating at a first duty cycle with a first duty factor, the second output stage comprising means for operating at a second duty cycle with a second duty factor, the second duty factor greater than the first duty factor, and the second duty cycle shorter than the first duty cycle,
 whereby the voltage rails required to drive the output stage is limited by the extent of output so that a significant audio output signal is available, despite minimal size.

12. The invention as set forth in claim 11 and comprising a integrated circuit having a variable gain control.

13. The invention as set forth in claim 11 and comprising a capacitor coupled to the power amplifier for tracking input signals.

14. The invention as set forth in claim 11 and comprising a power integrated circuit and a common base circuit isolating the power integrated circuit, and means for sensing a control voltage across the common base circuit.

15. The invention as set forth in claim 11 and comprising a variable gain stage at the input.

16. An audio amplifier comprising:
 an input stage for receiving an audio signal;

an output stage for coupling an amplified audio signal to an audio transducer;

the output stage having a plurality of staggered intermediate stages, including a first stage comprising first amplifying means for operating over a first duty cycle at a first duty factor, and a second stage comprising second amplifying means for operating over a second duty cycle at a second duty factor, the second duty factor being in excess of the first duty factor, whereby the first duty cycle is greater than the second duty cycle, thereby allowing the use of more economical, yet responsive higher quality semiconductor components at the first stage, without the necessity for protection circuitry.

* * * * *